United States Patent

Choi

Patent Number: 5,831,922
Date of Patent: Nov. 3, 1998

[54] SEMICONDUCTOR DEVICE HAVING A REFRESH DEVICE OF A NOISE REDUCTION TYPE

[75] Inventor: Jae Myoung Choi, Ichon, Rep. of Korea

[73] Assignee: Hyundai Electronics Industries Co., Ltd., Kyoungki-do, Rep. of Korea

[21] Appl. No.: 953,344

[22] Filed: Oct. 17, 1997

[30] Foreign Application Priority Data

Oct. 22, 1996 [KR] Rep. of Korea ............ 96-47403

[51] Int. Cl.⁶ .................................... G11C 7/00
[52] U.S. Cl. .............................. 365/222; 365/233
[58] Field of Search .................. 365/222, 230.03, 365/233

[56] References Cited

U.S. PATENT DOCUMENTS

| | | | |
|---|---|---|---|
| 5,321,661 | 6/1994 | Iwakiri et al. | 365/222 |
| 5,335,202 | 8/1994 | Manning et al. | 365/222 |
| 5,402,384 | 3/1995 | Fujisawa | 365/222 |
| 5,475,646 | 12/1995 | Ogihara | 365/222 |
| 5,477,491 | 12/1995 | Shirai | 365/222 |

*Primary Examiner*—Son T. Dinh
*Attorney, Agent, or Firm*—Gary M. Nath; Nath & Associates

[57] ABSTRACT

A semiconductor device having a refresh device of a noise reduction type lowers a peak current value by sequentially performing refresh operations about a plurality of dynamic RAMs (DRAMs) in a system having a daisy chain structure, thereby reducing noises generated from the system.

1 Claim, 3 Drawing Sheets

SEMICONDUCTOR DEVICE HAVING A REFRESH DEVICE OF A NOISE REDUCTION TYPE

BACKGROUND OF THE INVENTION

1. Field of the Invention

The present invention relates to a semiconductor device having a refresh device of a noise reduction type. More particularly, it relates to a semiconductor device having a refresh device of a noise reduction type which lowers a peak current value by sequentially performing refresh operations about a plurality of dynamic RAMs (hereinafter referred to as DRAMs) in a system having a daisy chain structure, thereby reducing noises generated from the system.

2. Description of the Prior Art

Conventionally, in a system in which a dynamic random access memory (DRAM) is constructed as a ring such as a random access memory bus (RAMBUS) or a sync link (SYNCLINK), a plurality of DRAMs are simultaneously operated during a cell refresh operation, thereby generating noises. It will be described with reference to FIG. 1.

FIG. 1 is a block diagram of a conventional system having a daisy chain structure, and illustrates a connection between DRAMs and a controller. The system having a daisy chain structure includes a plurality of DRAMs 10 (DRAM 0 to DRAM n) having an input/output terminal si/so and a controller 20 for controlling the DRAMs 10.

At this time, the controller 20 is a DRAM which is the nearest DRAM to the controller 20, generates a refresh operation signal SRO, and generates an enable signal for controlling each decoder of the DRAMs.

FIG. 2 is a detailed block diagram of the conventional DRAM 10 shown in FIG. 1.

As shown in FIG. 2, the DRAM 10 includes:

a buffer 11 which receives an input signal from an input terminal si, and stores the input signal therein;

a delay portion 12 which delays an output signal of the buffer 11 for a predetermined time, and outputs a delayed signal;

a decoder 13 which determines whether the present DRAM identification number is identical with an initially set DRAM identification number by decoding the output signal of the buffer 11, and outputs a refresh control signal C1 for refreshing a cell; and a RAM circuit 14 which receives the refresh control signal C1 generated from the decoder 13, and refreshes the cell.

A step for performing a refresh operation through the DRAM which is the nearest DRAM to the controller 20 in the aforementioned system is as follows. When the controller 20 outputs a refresh signal SR0 to the DRAM 10, the refresh signal is stored in the buffer 11, and the output signal of the buffer 11 is input to the decoder 13 and the delay portion 12.

The decoder 13 determines whether the input signal from the controller 20 is identical with an identification number of the present DRAM by decoding the output signal of the buffer 11, and thus makes the RAM circuit 14 perform a refresh operation. If the refresh operation of the RAM circuit 14 is performed, the decoder 13 outputs a refresh control signal C1 to the delay portion 12, and makes the refresh signal latched be output to a second DRAM which is the nearest DRAM to the present DRAM.

Accordingly, the second DRAM receiving the refresh signal performs the operation equal to that of the previous DRAM. Such operation is performed in all DRAMs mutually connected via a chain.

However, in the refresh method of the conventional daisy chain structure, as shown in FIGS. 3A to 3F, the delay time is very shorter than a refresh time performed in DRAM, so a time difference between the refresh time performed in a first DRAM and another refresh time performed in a second DRAM is little. That is, the time difference is deemed to be negligible, so that the refresh operations of all DRAMs are performed at about the same time.

Namely, referring to FIGS. 3A to 3F, a first timing at which a word line of a first DRAM DRAM0 operated by a first refresh signal of FIG. 3A is refreshed, a second timing at which a word line of a first DRAM DRAM0 operated by a first refresh signal SR0 is refreshed, a second time at which a word line of a second DRAM DRAM1 operated by a second refresh signal SR1 is refreshed, and a third timing at which a word line of a third DRAM DRAM2 operated by a third refresh signal SR2 is refreshed, are hardly distinguished from one another.

As a result, the plurality of DRAMs perform the refresh operations at the same time, a high peak current is generated in the system, thereby causing noises in the system.

SUMMARY OF THE INVENTION

Accordingly, the present invention is directed to a semiconductor device that substantially obviates one or more of the problems due to limitations and disadvantages of the related art.

An objective of the present invention is to provide a semiconductor device, when a refresh signal is input to a DRAM via an input terminal, which semiconductor device outputs the refresh signal from the DRAM to the next DRAM after finishing the refresh operation, thereby causing each refresh operation of a plurality of DRAMs to be sequentially generated.

To achieve the above objective, the present invention inputs a refresh signal into a decoder instead of a normal low address after the refresh signal passes through the buffer, selects a word line of a cell array, and thus outputs the refresh signal to the next DRAM when refresh operations of all cells are finished.

In a semiconductor device having a refresh device in a system having a daisy chain structure, a DRAM having a refresh device in accordance with the present invention includes:

a storing portion which receives an input signal from an input terminal of a DRAM, and stores the input signal therein;

a decoder which determines whether a present DRAM identification number is identical with an initially set DRAM identification number by decoding an output signal of the storing portion, and outputs a refresh control signal for refreshing a cell;

a refresh address generator which receives the refresh control signal of the decoder as an input, and generates a refresh address by using a refresh signal generated from the storing portion;

an address decoder which receives the refresh address of the refresh address generator as an input, and generates a normal low address by decoding the refresh address according to the refresh control signal of the decoder; and a RAM circuit which refreshes a cell selected in response to the normal low address of the address decoder, and outputs the refresh signal to the next DRAM after finishing the refresh operation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF THE PREFERRED EMBODIMENTS

Reference will now be made in detail to the preferred embodiments of the present invention, examples of which are illustrated in the accompanying drawings.

Figure 1:
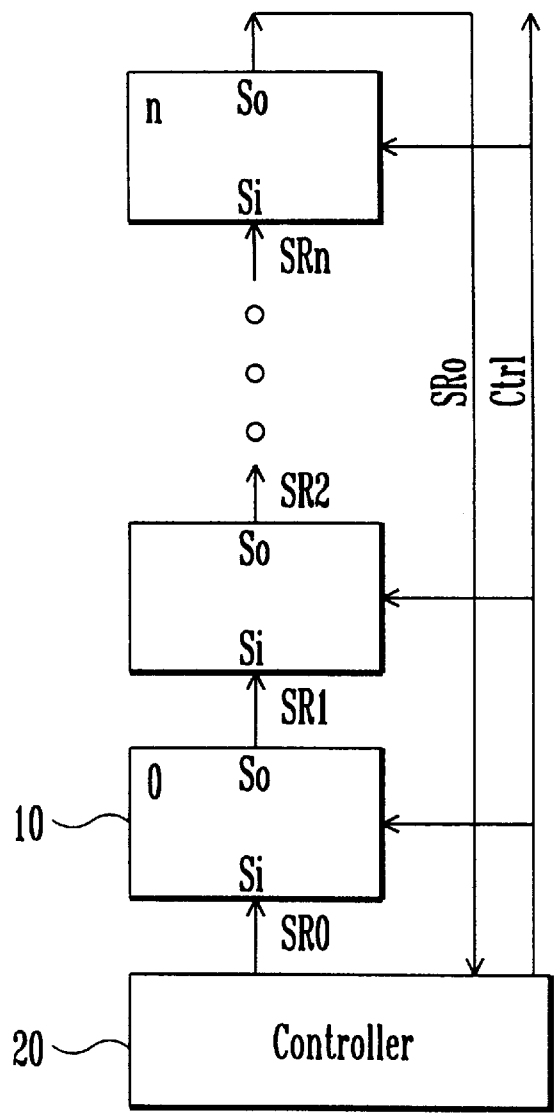
FIG. 1 is a block diagram of a system having a daisy chain structure, and illustrates a connection between DRAMs and a controller.
Figure 2:
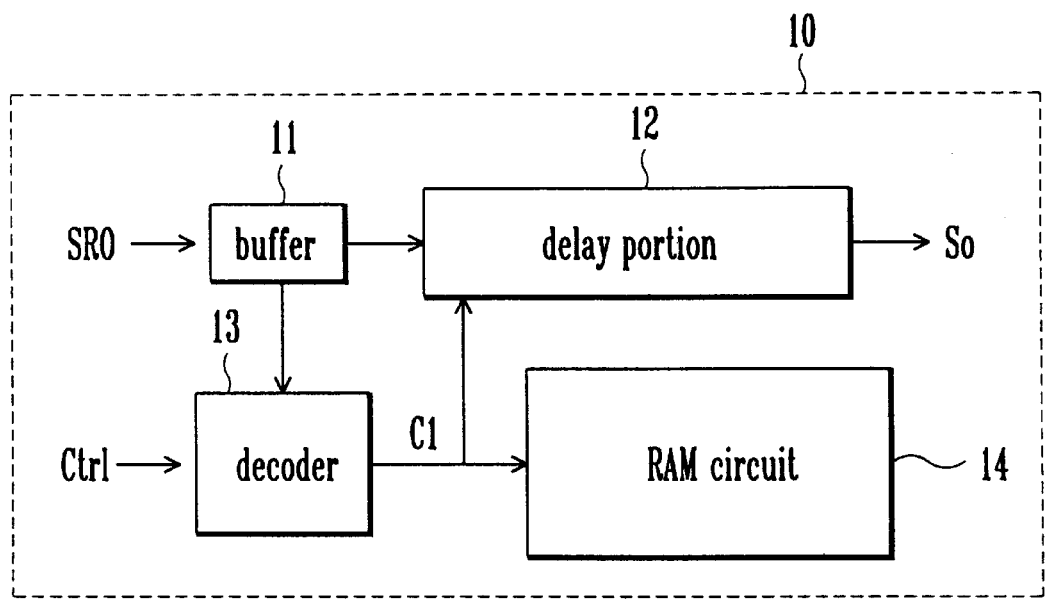
FIG. 2 is a detailed block diagram of FIG. 1's conventional DRAM including a refresh device.
Figure 3:
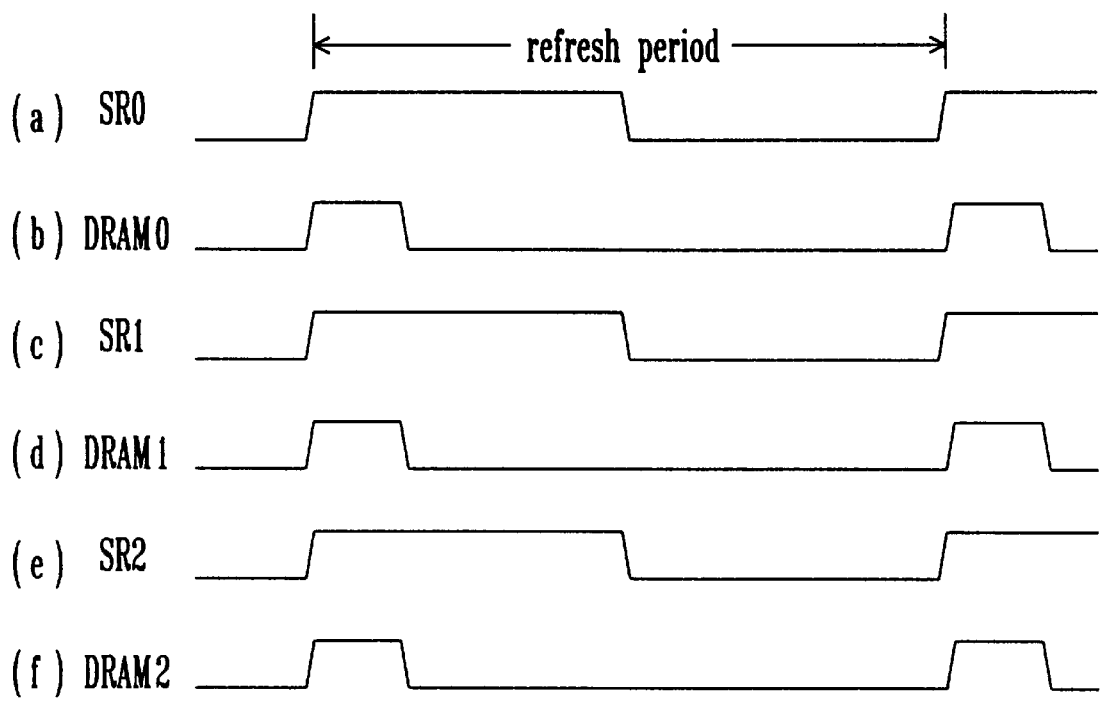
FIG. 3 shows timing diagrams for the conventional DRAMs of FIG. 2.
Figure 4:
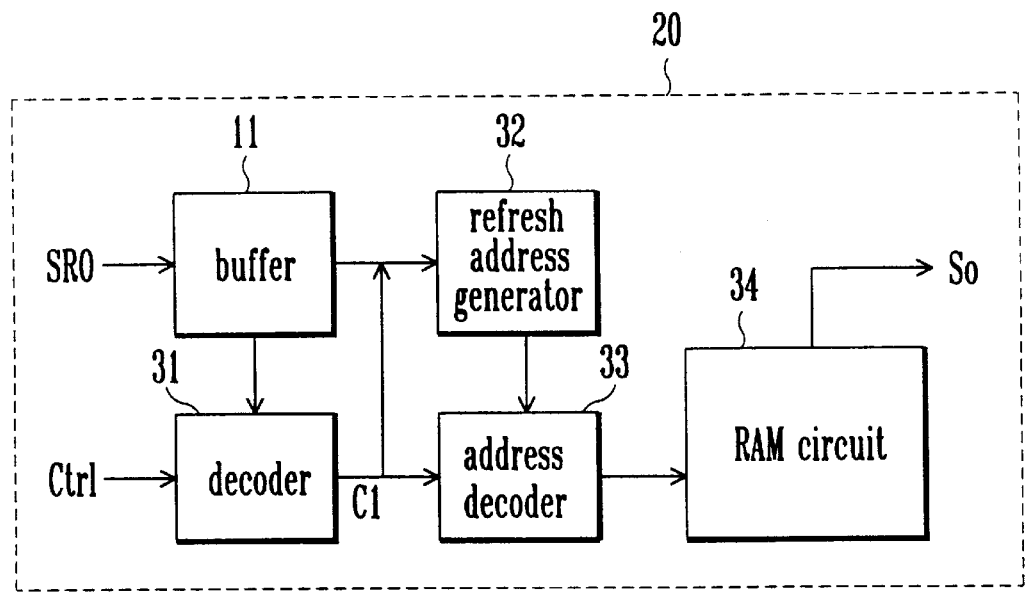
FIG. 4 is a detailed block diagram of a DRAM including a refresh device in accordance with a preferred embodiment of the present invention.

FIG. 4 is a block diagram illustrating a device for performing a refresh operation in accordance with a preferred embodiment of the present invention.

As shown in FIG. 4, the device for performing a refresh operation includes:

a buffer 11 which receives an input signal from an input terminal si of a DRAM 30, and stores the input signal therein;

a decoder 31 which determines whether a present DRAM identification number is identical with an initially set DRAM identification number by decoding the output signal of the buffer 11, and outputs a refresh control signal C1 for refreshing a cell;

a refresh address generator 32 which receives the refresh control signal C1 of the decoder 31 as an input, and generates a refresh address by using a refresh signal generated from the buffer 11;

an address decoder 33 which receives the refresh address of the refresh address generator 32 as an input, and generates a normal low address by decoding the refresh address according to the refresh control signal of the decoder 31; and a RAM circuit 34 which refreshes a cell selected in response to the normal low address of the address decoder 33, and outputs the refresh signal to the next DRAM after finishing the refresh operation.

A step for performing a refresh operation through the DRAM which is the nearest DRAM to a controller 20 in the aforementioned system is as follows. When the controller 20 outputs a refresh signal SR0 to the DRAM 30, the refresh signal is stored in the buffer 11, and the output signal of the buffer 11 functioned as the storing portion is input to the decoder 31 and the refresh address generator 32.

The decoder 31 decodes the output signal of the buffer 11, and outputs a refresh control signal C1 for performing the refresh operation to both refresh address generator 32 and the address decoder 33. The refresh address generator 32 receiving the refresh control signal C1 generates a refresh address through the refresh signal generated from the buffer 11, and then outputs the refresh address to the address decoder 33.

The address decoder 33 re-decodes the refresh address of the refresh address generator 32 as a real word line address applied to a memory cell, and then inputs the address into the RAM circuit 34. The RAM circuit 34 performs a refresh operation according to the input address.

When the refresh operation is finished, the RAM circuit 34 outputs a refresh signal to a second DRAM. The second DRAM outputs the refresh signal to a third DRAM, after the above operations are performed and a refresh operation of the second DRAM is finished.

The above operations are sequentially performed with respect to all DRAMs connected to the chain. A refresh operation generated by the refresh device according to the present invention will now be described with reference to FIGS. 5A to 5F.

In the present invention, after a first DRAM which is the nearest DRAM to the controller 20 performs a refresh operation, the refresh signal is input to the next DRAM via the first DRAM. Accordingly, there is a predetermined distance between an enable signal of a refresh signal SR0 (shown in FIG. 5A) and another enable signal of the next refresh signal SR1 (shown in FIG. 5C).

Figure 5:
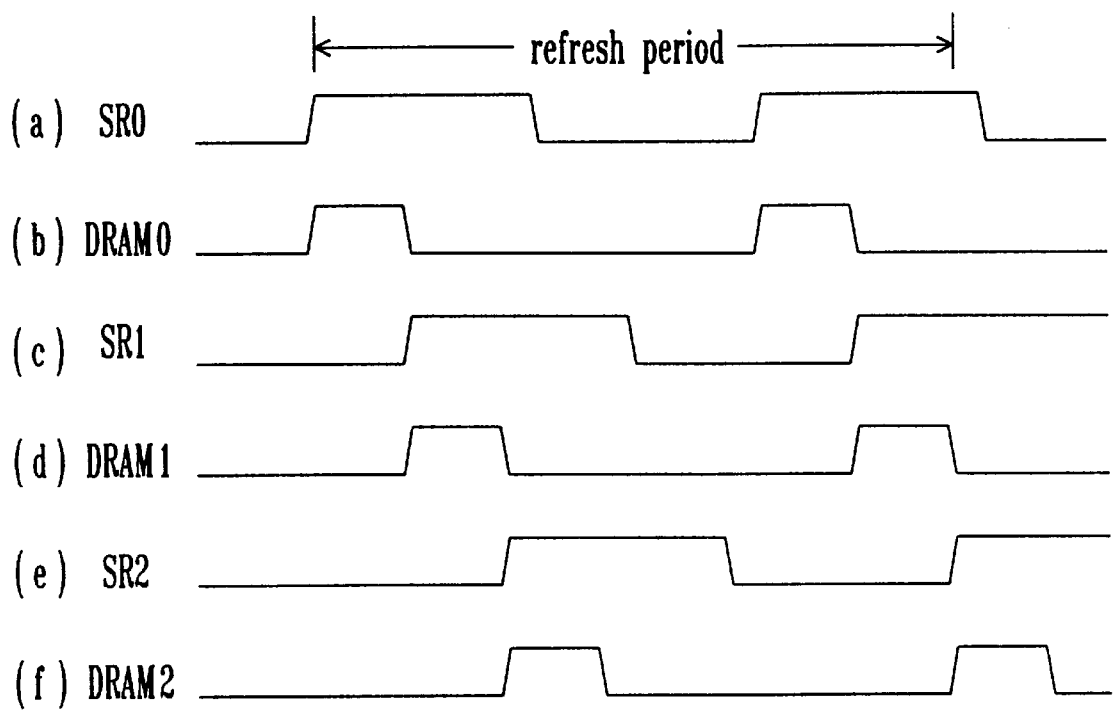
FIG. 5 shows timing diagrams for the DRAMs in accordance with a preferred embodiment of the present invention.

Therefore, as shown in FIGS. 5B and 5D, there is a refresh operation having the predetermined distance between the enable signals in a DRAM's refresh operation performed by each refresh signal. In this case, a plurality of DRAMs mutually connected by a daisy chain do not perform refresh operations at the same time, sequentially perform the refresh operation, and thus do not generate a high peak current generated in the conventional DRAMs.

The refresh operations having a predetermined distance therebetween have a refresh period of several microseconds $\mu$s at a power down mode. Accordingly, although a plurality of DRAMs are sequentially operated, refresh operations of all DRAMs are sequentially performed in the entire refresh time.

As described above, when refreshing the plurality of DRAMs of a daisy chain structure, the present invention reduces a peak current value by sequentially performing a refresh operation about all DRAMs, thereby suppressing noises in a system.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. In a semiconductor device having a refresh device in a system of a daisy chain structure, a semiconductor device, comprising:

storing means which receives an input signal from an input terminal of a dynamic random access memory (DRAM), and stores the input signal therein;

a decoder which determines whether a present DRAM identification number is identical with an initially set DRAM identification number by decoding an output signal of said storing means, and then generates a refresh control signal for refreshing a cell;

a refresh address generator which receives said refresh control signal of said decoder as an input, and generates a refresh address by using a refresh signal generated from said storing means;

an address decoder which receives said refresh address of said refresh address generator as an input, and generates a normal low address by decoding said refresh address according to said refresh control signal of said decoder; and a RAM circuit which refreshes a cell selected in response to said normal low address of said address decoder, and outputs said refresh signal to the next DRAM after finishing a refresh operation of said cell.

* * * * *